United States Patent [19]

Sandhu

[11] Patent Number: 5,296,758
[45] Date of Patent: Mar. 22, 1994

[54] OUTPUT BUFFER WITH GROUND BOUNCE COMPENSATION

[75] Inventor: Bal S. Sandhu, Fremont, Calif.

[73] Assignee: National Semiconductor Corporation, Santa Clara, Calif.

[21] Appl. No.: 840,348

[22] Filed: Feb. 24, 1992

[51] Int. Cl.⁵ .................. H03K 17/16; H03K 19/092
[52] U.S. Cl. .................................. 307/443; 307/475; 307/451; 307/473
[58] Field of Search .................. 307/475, 443, 451

[56] References Cited

U.S. PATENT DOCUMENTS

| 4,918,339 | 4/1990 | Shigeo et al. | 307/443 |
| 4,947,063 | 8/1990 | O'Shaughnessy et al. | 307/443 |
| 4,959,561 | 9/1990 | McDermott et al. | 307/443 |
| 5,028,817 | 7/1991 | Patil | 307/443 |
| 5,216,299 | 6/1993 | Wanlass | 307/443 |

Primary Examiner—Edward P. Westin
Assistant Examiner—Richard Roseen
Attorney, Agent, or Firm—Flehr, Hohbach, Test, Albritton & Herbert

[57] ABSTRACT

A ground bounce compensating output buffer for an integrated circuit is disclosed. The circuit includes a pull-up transistor, the gate of the pull-up transistor is coupled to an input line, the output of the pull-up transistor is coupled to an output line. The pull-up transistor discharges current to ground during a state transition. The discharge of current to ground creates ground bounce due to the resistance and inductance of the package lead. A pull-down transistor is also provided. The gate of the pull-down transistor is also coupled to the input line, the output of the pull-down transistor is also coupled to the output line. The pull-down transistor also discharges current to ground during a state transition and thereby produces ground bounce. To reduce the ground bounce, the disclosed circuit includes compensating devices positioned between the input line and the gate of the pull-down transistor. The first compensating device includes a mechanism for regulating drive current to the pull-down transistor in the presence of ground bounce. A second compensating device limits voltage to the first compensating device in the presence of ground bounce. As a result, the second compensating device further regulates drive current to the pull-down transistor during ground bounce. A third compensating device generates a constant drive current to the pull-down transistor in the presence of ground bounce. The design of the circuit provides optimal signal delays to minimize totem pole current which would otherwise produce additional ground bounce.

15 Claims, 6 Drawing Sheets

OUTPUT BUFFER WITH GROUND BOUNCE COMPENSATION

BRIEF DESCRIPTION OF THE INVENTION

The present invention relates generally to output buffers for integrated circuits. More particularly, the present invention relates to a ground bounce compensating output buffer which may be used with high speed memories.

BACKGROUND OF THE INVENTION

The leads of an integrated circuit package possess inductance and resistance. Typically, a number of outputs on an integrated circuit are tied to a common ground lead. Indeed, it is common to have a single ground lead for an entire circuit. In these circumstances, when one or more outputs switch from high to low, ground bounce is produced as the discharged current experiences the resistance and inductance of the ground lead. As a result, excess current in the form of noise spikes may be experienced on the outputs of the other circuit elements. This phenomenon is especially problematic for delicate circuits such as sense amplifiers.

One prior art solution for addressing the problem of ground bounce is to use multiple ground leads on the package. This reduces, but does not eliminate the noise spikes and transients. Moreover, this approach reduces the number of pins available for logic inputs and outputs.

The ground bounce problem can be readily controlled if the speed of the output buffer turn-on is not an issue. That is, the output buffer can be designed so that it is sufficiently slow to produce a constant slew rate. This solution is not available when designing high speed circuits, where the output buffers cannot be slowed down.

The ground bounce problem is more fully appreciated with reference to FIG. 1. FIG. 1 depicts a conventional output buffer 20 which includes pull-up transistor $Q_1$ (22) and pull-down transistors $Q_2$ (24) and $Q_3$ (26). Pull-down transistor $Q_2$ (24) is relatively small while pull-down transistor $Q_3$ (26) is relatively large and therefore serves as the main pull-down device. Pull-down transistors $Q_2$ and $Q_3$, along with a plurality of other transistors in the circuit, are coupled to a ground plane which is coupled to the ground lead of the package (not shown). Relying upon the circuit of FIG. 1, the ground bounce problem may be demonstrated with a simple example.

The data to this output buffer has three gate delays from $D_{in}$ (28) to the gate of the pull-up transistor $Q_1$ (22). In particular, the input signal must propagate through $G_1$ (30), $G_2$ (32), and $G_3$ (34) prior to reaching $Q_1$ (22). On the other hand, only two gate delays are required for the path from $D_{in}$ (22) to the gates of the pull-down transistors $Q_2$ (24) and $Q_3$ (26). Namely, the input signal must propagate through gates $G_4$ (36) and $G_5$ (38). Because of the additional gate delay, when $D_{in}$ goes from low to high, the gates of $Q_2$ and $Q_3$ will begin going high while the gate of $Q_1$ is still in the process of going low. Therefore, in addition to the ground bounce generated due to the large current that is being discharged from the output load to ground, there is additional ground bounce produced by the totem-pole current flowing into ground while $Q_1$, $Q_2$, and $Q_3$ are simultaneously on during the cross-over point of their gate potential.

Ground bounce is thus associated with high to low voltage transitions on output nodes. Typically, ground bounce is worst when several output nodes simultaneously switch from high to low voltage. FIG. 1A depicts a series of output buffers 21 with output nodes 62. The inputs 28 to the output buffers 21 are coupled to system logic 23. The series of output buffers 21 and system logic form a portion of package 25 with a number of output leads 29. The output buffers 21 are coupled to output ground 31. Output ground 31 is coupled to a ground lead of package 25, which is also coupled to logical ground $V_{ss}$.

FIG. 2 provides a simplified representation of the prior art output buffer depicted in FIG. 1. The block representations of the circuit elements correspond to the blocks drawn in phantom in FIG. 1. FIG. 2 will be used to discuss the remaining aspects of the prior art output buffer 20 and to highlight the distinctions between the prior art and the present invention.

The simplified circuit 20A includes an inverting driver A (50) which is coupled to a pull-up driver with tri-state circuitry (52). Pull-up driver with tri-state circuitry (52) drives inverting driver B (64), which drives transistor $Q_1$ (22). Tri-state circuitry also forms a portion of pull-down driver 54, which drives inverting driver A (66) and inverting driver B (68), which respectively drive transistor $Q_2$ (24) and transistor $Q_3$ (26). Tri-state reset is established through tri-state reset circuitry 56. A high input value on reset line 58 turns on each transistor within the reset block, thereby turning off transistors $Q_1$ (22), $Q_2$ (24), and $Q_3$ (26). These transistors are therefore in a high impedance state, causing output node 62 to be isolated or "tri-stated". A low input value on tri-state input line 60 maintains the tri-state while a high input value enables output to the buffer output line 62.

OBJECTS AND SUMMARY OF THE INVENTION

It is a general object of the present invention to provide a ground bounce compensating output buffer which may be used with high speed memories.

It is another object of the present invention to provide an output buffer which does not depend upon multiple leads to reduce ground bounce. It is still another object of the present invention to provide a ground bounce compensating output buffer which can handle additional current produced from totem-pole current phenomenon.

It is yet another object of the present invention to provide a high speed ground bounce compensating output buffer which may be used with high speed memory devices.

These and other objects are achieved by a ground bounce compensating output buffer in accordance with the present invention. The circuit includes a pull-up transistor, the gate of the pull-up transistor is coupled to an input line, the output of the pull-up transistor is coupled to an output line. The pull-up transistor discharges totem-pole current to ground during a state, or cross-over, transition. The discharge of current to ground creates ground bounce due to the resistance and inductance of the package lead. A pull-down transistor is also provided. The gate of the pull-down transistor is also coupled to the input line, the output of the pull-down transistor is also coupled to the output line. The pull-down transistor also discharges current to ground during a state transition and thereby produces ground bounce. To reduce the ground bounce, the disclosed circuit includes compensating devices positioned between the input line and the gate of the pull-down transistor. The first compensating device includes a mechanism for regulating drive current to the pull-down transistor in the presence of ground bounce. A second compensating device limits voltage to the first compensating device in the presence of ground bounce. As a result, the second compensating device further regulates drive current to the pull-down transistor during ground bounce. A third compensating device generates a constant drive current to the pull-down transistor in the presence of ground bounce. The design of the circuit provides optimal signal delays to minimize totem pole current which would otherwise produce additional ground bounce.

BRIEF DESCRIPTION OF THE DRAWINGS

For a better understanding of the nature and objects of the invention, reference should be had to the following detailed description taken in conjunction with the accompanying drawings, in which:

FIG. 1A is a simplified representation of a circuit package which includes system logic coupled to a series of output buffers.

Like reference numerals refer to corresponding parts throughout the several views of the drawings.

DETAILED DESCRIPTION OF THE INVENTION

Figure 1:
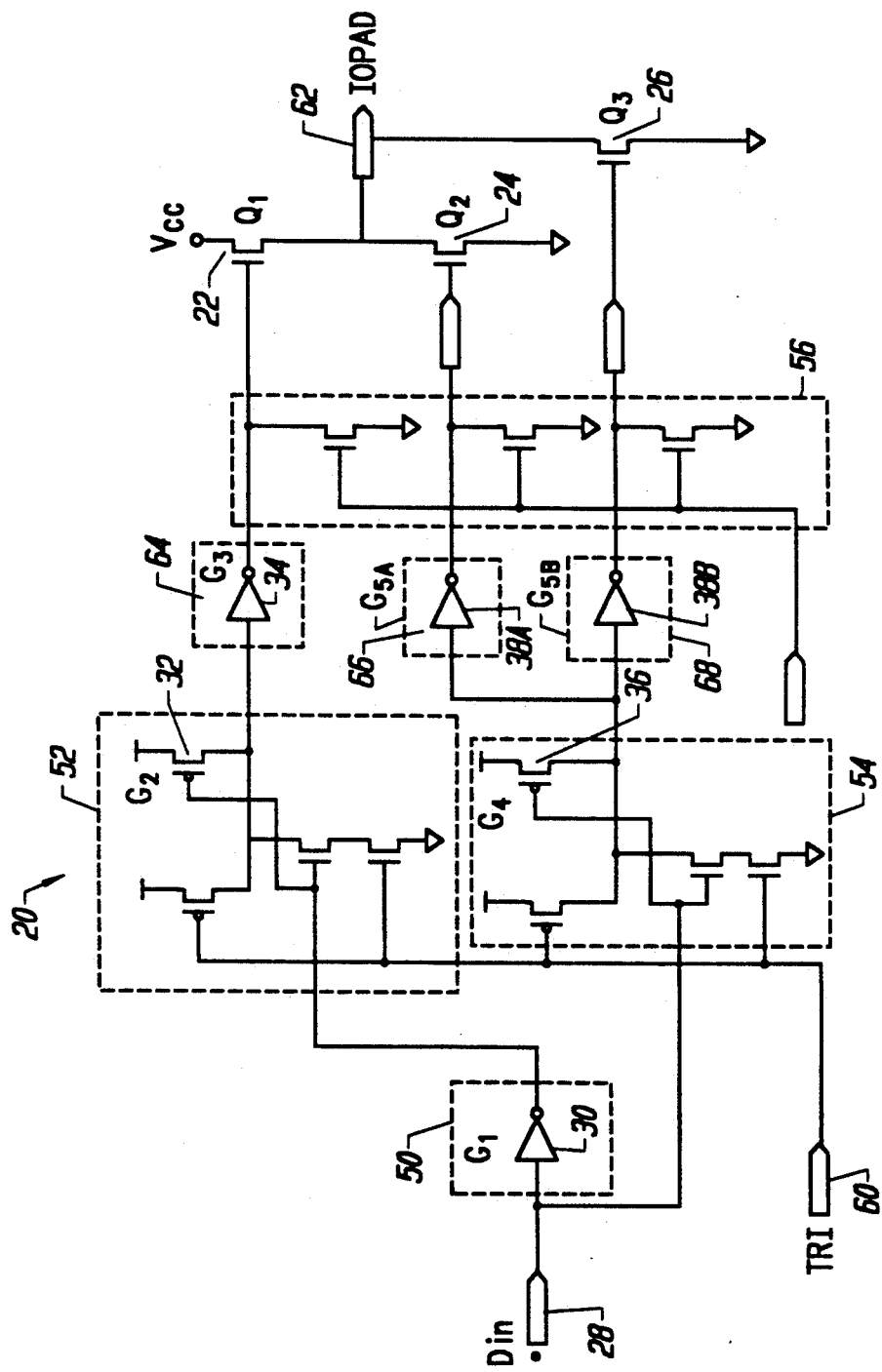
FIG. 1 is a schematic of a prior art output buffer which experiences ground bounce and totem-pole current phenomenon.
Figure 2:
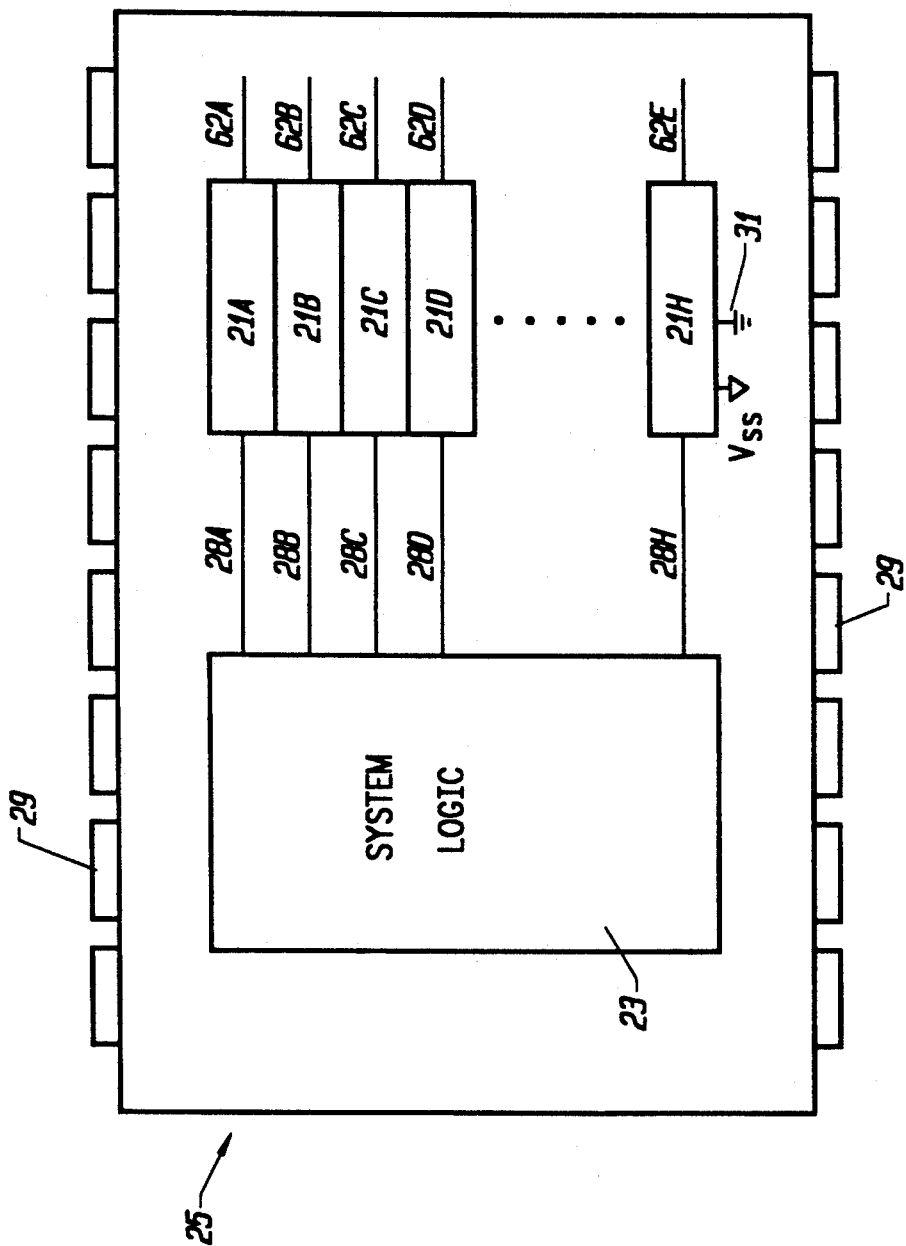
FIG. 2 is a simplified representation of the circuit of FIG. 1.
Figure 3:
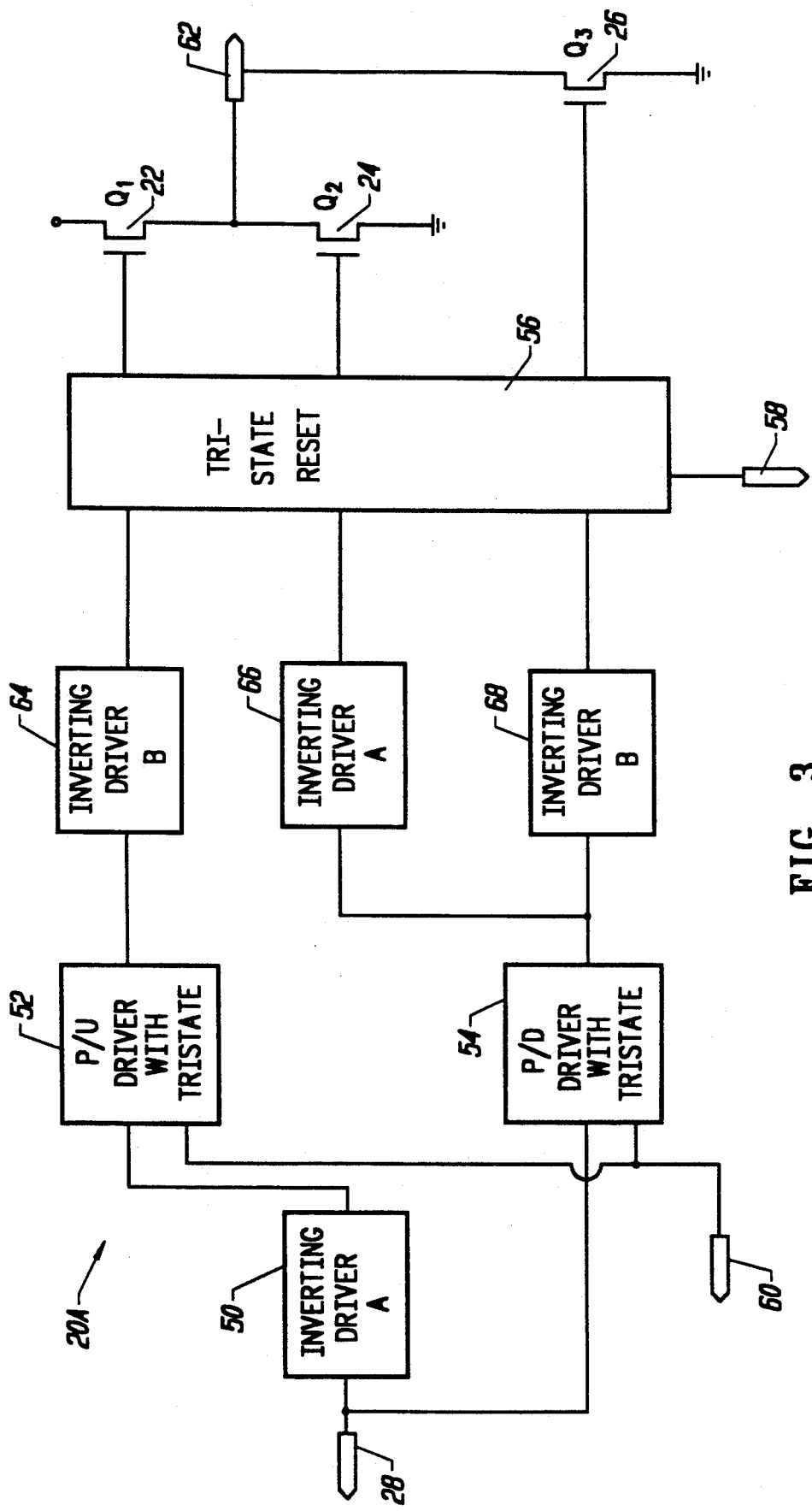
FIG. 3 is a simplified representation of a ground bounce compensating output buffer in accordance with the present invention.

FIG. 3 is a block diagram representation of a ground bounce compensating output buffer 21 in accordance with the present invention. The output buffer 21 includes transistors $Q_1$ (22), $Q_2$ (24), and $Q_3$ (26). The circuit 21 also includes prior art tri-state reset circuitry 56. The circuit 21 also includes a pull-up driver with tri-state circuitry 70, a pull-down driver with tri-state circuitry 72, and an additional pull-down driver 74.

The ground bounce compensating circuit 21 of the present invention also includes a number of non-conventional elements. In particular, the circuit 21 includes a ground bounce compensating driver 80. Supplemental ground bounce compensation may be provided by supplemental compensator 82. In accordance with the invention, ground bounce may be essentially eliminated by ground bounce clamp 84. Whether the ground bounce clamp feature is invoked is dependent upon the mode select 86.

Functional aspects of the ground bounce compensating circuit of the present invention will be described in reference to FIG. 3. A more detailed description of the circuit will be provided in relation to FIG. 4.

One advantage associated with the output buffer of the present invention is that the signal path from the data input line 28 to the pull-up transistor $Q_1$ (22) has only one gate delay through pull-up driver 70. On the other hand, the signal path to transistors $Q_2$ and $Q_3$ includes two gate delays, one gate delay through pull-up driver 72 and another gate delay through either pull-up driver 74 or compensating driver 80. Since transistor $Q_1$ (22) has only one gate delay, it will start to turn off before $Q_2$ (24) and $Q_3$ (26) start turning on. Therefore, the large totem-pole current to ground experienced in the prior art is significantly reduced.

Another advantage associated with the output buffer of the present invention relates to compensating driver 80. Compensating driver 80 turns on the large pull-down transistor $Q_3$ in a manner which minimizes ground bounce. In particular, when ground bounce causes the internal ground node voltage to increase, compensating driver 80 reduces the drive current to $Q_3$ (26), generally in proportion to the amount of ground bounce, thereby turning $Q_3$ (26) on slower and reducing additional ground bounce. Thus, the rate at which $Q_3$ turns on is inversely proportional to the voltage bounce on the logical ground node $V_{ss}$.

A supplemental compensator 82 may also be provided in accordance with the present invention. If employed, an increase in ground node voltage causes the supplemental compensator to reduce the drive voltage available for the compensating driver 80. This further reduces the drive current to $Q_3$ (26) during ground bounce, causing $Q_3$ to be turned on gradually. Consequently, $Q_3$ (26) is turned on fully only after ground bounce subsides, which reduces the creation of additional ground bounce as $Q_3$ (26) is turned on.

The present invention also includes a ground bounce clamp 84 feature. This feature largely clamps all ground bounce. The trade-off for the reduction of the ground bounce is that the clamping feature slows the circuit down by approximately 0.5 nanoseconds. The ground bounce clamp feature of the present invention utilizes delay elements to produce a constant rate of turn-on for the $Q_3$ (26) transistor. As a result, ground bounce is largely clamped.

Thus, in accordance with the present invention, a number of benefits are obtained. First, ground bounce is substantially reduced without relying upon multiple ground leads. In addition, the problem of totempole current is reduced in accordance with the present invention. Further, as will be more fully described below, the reduction in ground bounce is achieved at high speeds. Consequently, the output buffer of the present invention may be used with high speed memories.

Figure 4:
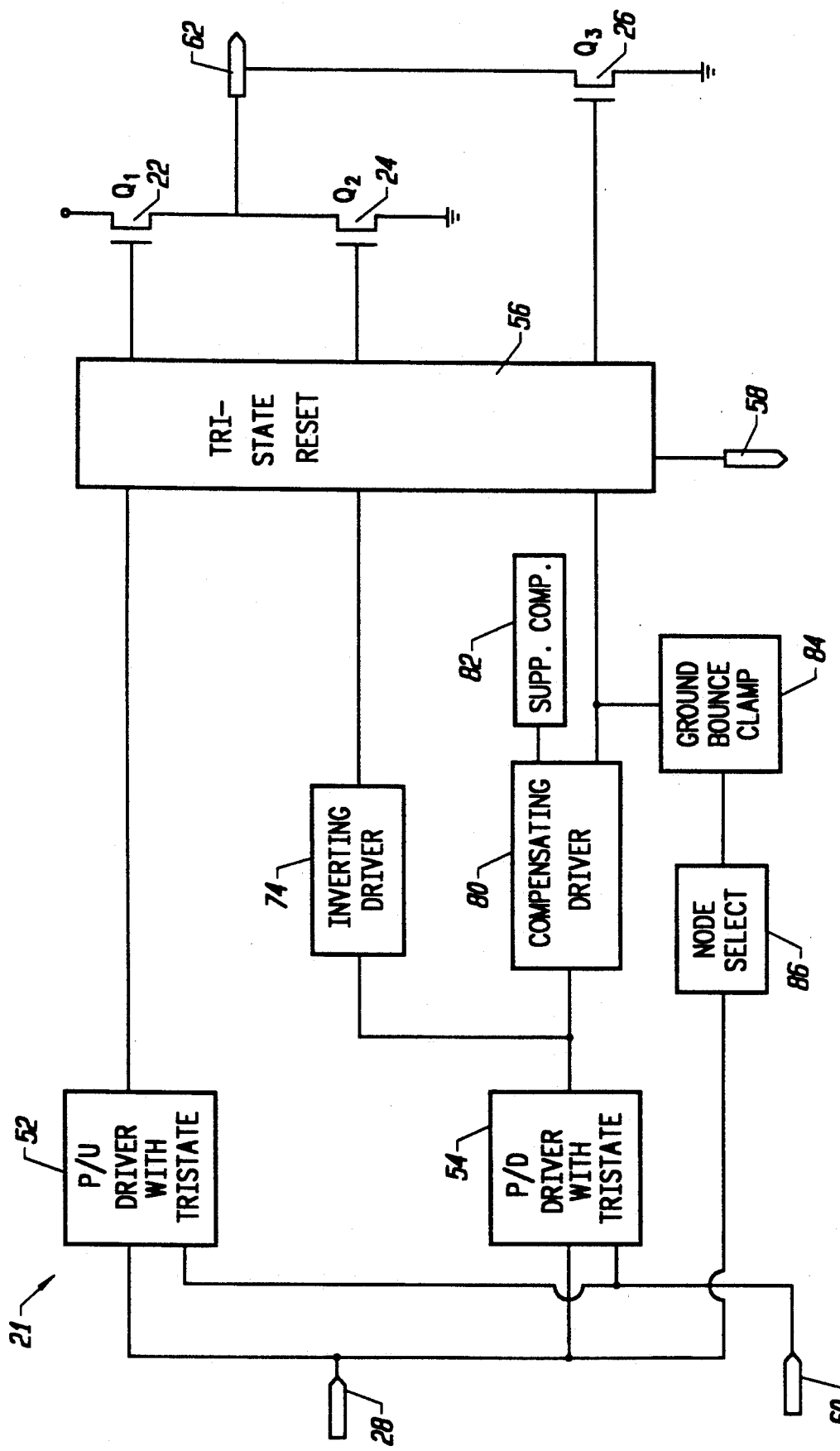
FIG. 4 is a schematic of a ground bounce compensating output buffer in accordance with the present invention.

Turning to FIG. 4, a more detailed schematic is provided of a ground bounce compensating output buffer 21 in accordance with the present invention. The circuit 21 includes a compensating driver 80. The circuit 21 may also include a supplemental compensator 82, a ground bounce clamp 84 and a mode select 86.

The ground bounce compensating circuit of FIG. 4 operates in the following manner. Consider a low to high transition on input line 28 while tri-state line 60 is enabled (logic low). In this case, the output of pull-up driver 70 (NOR gate 90) and pull-down driver 72 (NAND gate 92) will start to go low. The output of pull-up driver 70 will immediately go to pull-up transistor $Q_1$ (22), while the output of pull-down driver 72 must pass through another pull-down driver stage (74) and a compensating driver stage (80) before reaching pull-down transistors $Q_2$ (24) and $Q_3$ (26). As a result, $Q_1$ (22) will begin to turn off before $Q_2$ and $Q_3$ turn on. Consequently, the problem of excessive totem-pole current experienced in the prior art is largely eliminated with the present invention.

As the output of pull-down driver 72 goes low, pull-down driver 74 (inverter 94) starts turning on $Q_2$ (24) which causes the output load to begin to discharge to ground. Transistor $Q_2$ (24) is much smaller than transistor $Q_3$ (26). Transistor $Q_2$ (24) starts the output transition to ground.

The output of pull-down driver 72 also goes to compensating driver 80. In the preferred embodiment, compensating driver 80 is an inverter having transistors 100, 102, and 104. P-channel transistor 100 has its gate connected to the logic ground $V_{ss}$ and its drain is in series with the source of p-channel transistor 102. Thus, with the input to the compensating driver 80 going low, transistor 102 is turning on and n-channel transistor 104 is turning off. This turns on the gate of the main pull-down transistor $Q_3$ (26). Transistor $Q_3$ (26) aids the discharge started by transistor $Q_2$ (24).

In accordance with the invention, the rate at which transistor $Q_3$ (26) is turned on to aid the discharge started by transistor $Q_2$ (24) is a function of the amount of ground bounce. This feature of the invention is achieved as follows. The amount of current received at the source of transistor 102 is dependent upon the serially aligned drain of transistor 100. As previously mentioned, the gate of transistor 100 is coupled to logic ground $V_{ss}$. The gate of transistor 100 is normally at 0V. When ground bounce occurs, the gate-source voltage of transistor 100 decreases. Thus, the drive current of transistor 100 starts to decrease. This in turn reduces the drive current for the main pull-down transistor $Q_3$ (26). Consequently, transistor $Q_3$ (26) turns on more slowly than it would otherwise and thereby provides less current to ground and concomitant ground bounce. As ground bounce subsides, the gate-source voltage of transistor 100 increases, allowing greater drive current for transistor $Q_3$ (26). Thus, pull-down transistor $Q_3$ is not fully turned on until the ground bounce has already been reduced, thereby reducing the rate at which current is discharged to logic ground $V_{ss}$.

Consequently, in accordance with one aspect of the present invention, a small pull-down transistor $Q_2$ (24) and a large pull-down transistor $Q_3$ (26) are provided. The pull-down transistors begin to pull down the output, causing a discharge of current to ground. The resultant ground bounce is reduced by providing compensating means for reducing the amount of drive current to the large pull-down transistor $Q_3$ (26) in the presence of the ground bounce. The compensating means provides additional drive current to the large pull-down transistor $Q_3$ (26) when the ground bounce subsides. This feature, in conjunction with the reduced gate delay to the transistor $Q_1$ (22), as previously discussed, substantially reduces the ground bounce problem found in prior art output buffers.

Figure 5:
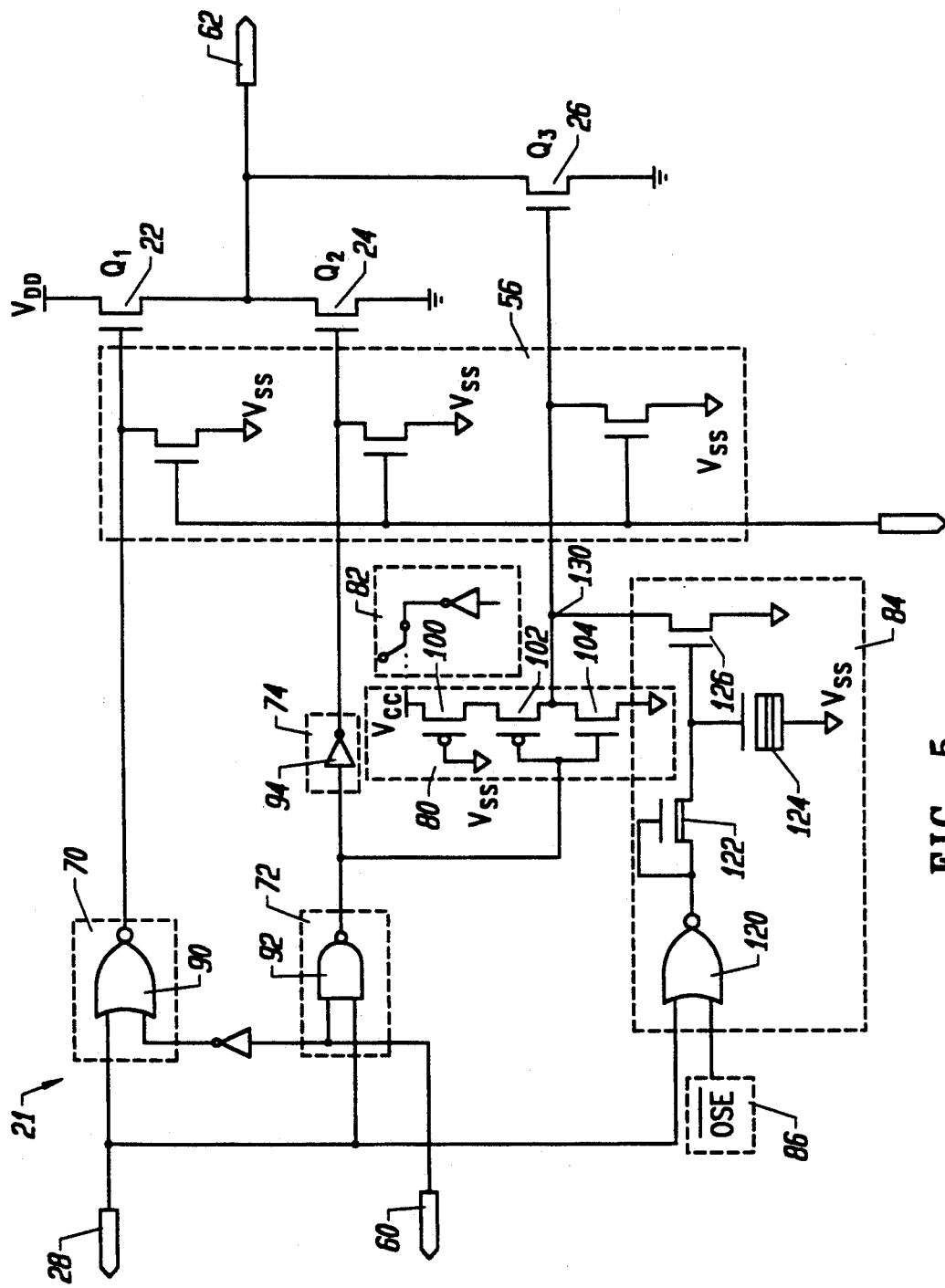
FIG. 5 is a schematic of the supplemental ground bounce compensation feature of the present invention.
Figure 6:
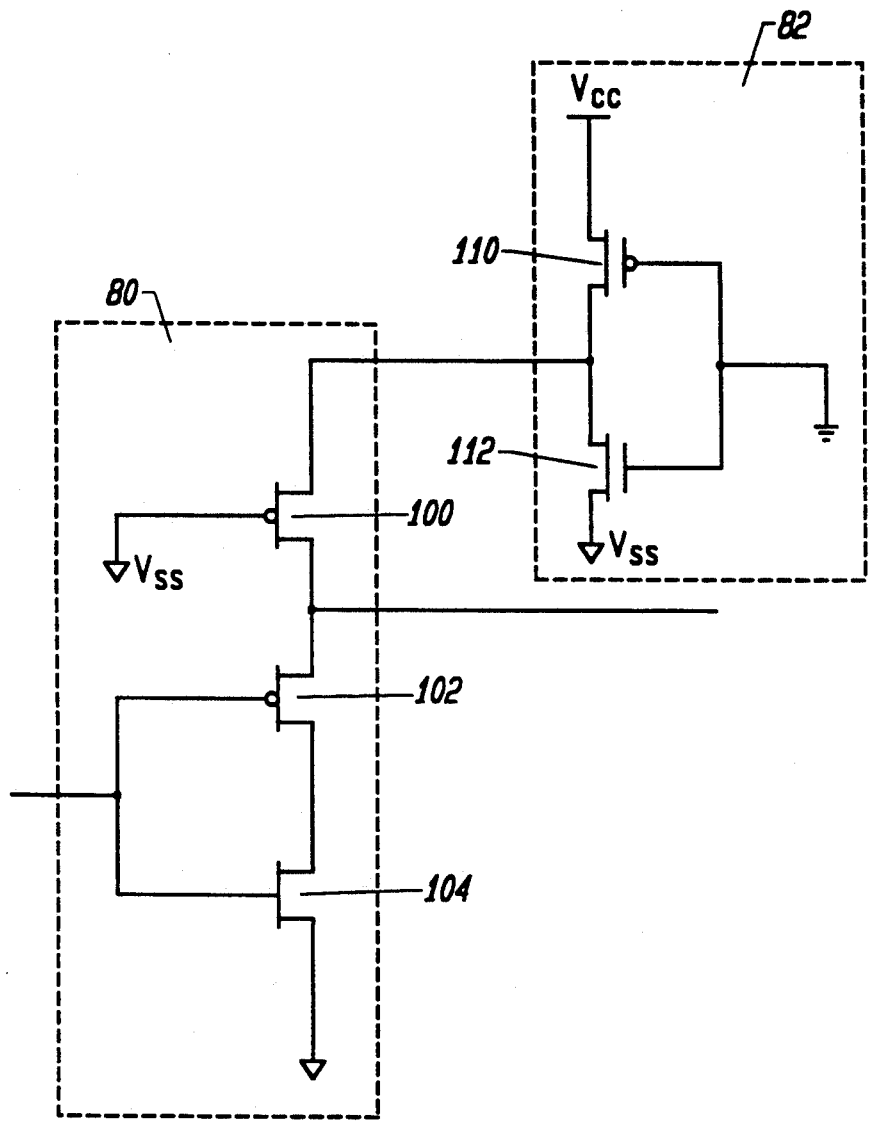

The compensating driver 80 of the present invention may be used in conjunction with supplemental compensator 82. As depicted in FIG. 4, supplemental compensator 82 may be an inverter whose output is coupled to the source of transistor 100. Turning to FIG. 5, a detailed embodiment of supplemental compensator 82, as coupled to compensating driver 80, is disclosed.

The supplemental compensator 82 provides additional ground bounce compensation if required. The supplemental compensator 82 may include transistors 110 and 112. The common gate of the transistors 110 and 112 is connected to the output buffer ground. The source of transistor 112 is coupled to logic $V_{ss}$. The source of transistor 110 is coupled to the source of transistor 100. Thus, in the absence of ground bounce, there is a full coupling of $V_{cc}$ to the source of transistor 100. However, the supplemental compensator 82 reduces the voltage to the source of transistor 100 in the presence of ground bounce. In particular, the buffer ground coupled to the gates of transistors 110 and 112 will rise faster than the logic $V_{ss}$ during ground bounce. If the voltage of buffer ground rises sufficiently (e.g., at least 1.5 volts) transistor 110 will become weaker, thereby reducing the voltage to the source of transistor 100 and the consequent drive current to transistor $Q_3$ (26). As ground bounce subsides, transistor 110 will turn back on hard and the voltage to the source of transistor 100 will increase, as will the drive current to transistor $Q_3$ (26).

Thus, supplemental compensator 82 of the present invention provides additional regulation of the drive current for transistor $Q_3$ (26). In particular, the presence of ground bounce will reduce the $V_{cc}$ available to drive current to the gate of $Q_3$ (26).

In accordance with another aspect of the invention, ground bounce can be largely eliminated by using ground bounce clamp 84. Returning to FIG. 4, ground bounce clamp 84 operates in the following manner. The ground bounce clamp 84 may be invoked by providing a 0V OSE(bar) signal to NOR gate 120. If the input signal is rising on input line 28 as in the previous example, then the output of NOR gate 120 will go low. Depletion transistor 122 and depletion capacitor 124 have an associated RC time constant which slows the output signal from NOR gate 120. Thus, initially, transistor 126 discharges current from the input to transistor $Q_3$ (26) at node 130. The signal from the NOR gate 120 is delayed, but then begins to turn off transistor 126. Thus, no more current is drawn at node 130. In sum, the ground bounce clamp 84 creates a constant rate of turn on for transistor $Q_3$, thereby limiting the ground bounce.

The mode select 86 box in FIG. 3 corresponds to the OSE(bar) signal which invokes the ground bounce clamp 84. The signal OSE(bar) may be a single bit output from an EEPROM memory cell (not shown) which can be individually programmed or erased, thereby enabling the skew of the output buffer to be programmed or erased. In the alternative, one may permanently program the skew of the output buffer in a particular mode by coupling the $V_{cc}$ or $V_{ss}$ node to the OSE(bar) input during the fabrication of the device.

The output buffer of the present invention can sink 24 mA. The worse case low output voltage for the circuit is 0.5 V (max), while the worse case high output voltage for the circuit is 2.4 V (min).

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. A ground bounce compensating output buffer comprising:
   an input line;
   an output line;
   a logic ground node;
   a pull-up transistor, the gate of said pull-up transistor being coupled to said input line, the output of said pull-up transistor being coupled to said output line;
   a pull-down transistor, the gate of said pull-down transistor being coupled to said input line, the drain of said pull-down transistor being coupled to said output line, and the source of said pull-down transistor being coupled to said ground node, a state transition on said pull-down transistor discharging current to said ground node, thereby producing increased voltage on said ground node; and
   means, connected between said input line and said gate of said pull-down transistor, for compensating for said increased voltage on said ground node, said compensating means regulating drive current to said pull-down transistor in the presence of said increased voltage on said ground node, said compensating means turning on said pull-down transistor at a rate inversely related to said increased voltage on said ground node.

2. The ground bounce compensating output buffer of claim 1 further comprising supplemental compensating means coupled to said compensating means, said supplemental compensating means limiting said compensating means, source voltage during said increased voltage on said logic ground node, so as to further regulate the drive current to said pull-down transistor.

3. The ground bounce compensating output buffer of claim 1 further comprising ground bounce clamping means connected between said compensating means and said gate of said pull-down transistor, said clamping means including an associated RC time constant which reduces said drive current to said pull-down transistor and thereby generates a substantially constant drive current to said pull-down transistor.

4. The ground bounce compensating output buffer of claim 1 further comprising:
   a first stage pull-up driver connected between said input line and said pull-up transistor; and
   a first stage pull-down driver connected between said input line and said compensating means, wherein said first stage pull-down driver and said compensating means have an associated signal delay which is greater than said first stage pull-up driver so that said pull-down transistor does not begin to discharge current to said ground node until said pull-up transistor is in the process of turning off.

5. In an output buffer including an input line and a pull-up transistor with a pull-up driver therebetween, and a pull-down transistor with one or more pull-down drivers therebetween, said pull-down transistor being coupled to a logical ground node, said output buffer producing increased voltage on said logical ground node during a state transition of said pull-up transistor, the improvement comprising:
   means, connected between said input line and said pull-down transistor, for compensating for said increased voltage on said logical ground node, said compensating means regulating drive current to said pull-down transistor at a rate inversely related to said increased voltage on said logical ground node.

6. The apparatus of claim 5 wherein said compensating means is coupled to the gate of said pull-down transistor, said compensating means reducing said drive current to said gate in the presence of said increased voltage on said logical ground node and increasing said drive current to said gate in the absence of said increased voltage on said logical ground node.

7. The apparatus of claim 5 further comprising supplemental compensating means coupled to said compensating means, said supplemental compensating means reducing the voltage provided to said compensating means in the presence of said increased voltage on said logical ground node, thereby reducing said drive current to said gate of said pull-down transistor.

8. The apparatus of claim 7 further comprising clamping means, said clamping means including an output node coupled to said gate of said pull-down transistor and an input node coupled to said input line, said clamping means including means for generating a substantially constant drive current to said pull-down transistor during said increased voltage on said logical ground node.

9. An output buffer for reducing ground bounce, comprising:
   a logical ground node;
   an input line;
   an output line;
   a pull-up driver coupled to said input line;
   a pull-up transistor coupled to said pull-up driver and said output line;
   a first stage pull-down driver coupled to said input line;
   a second stage pull-down driver coupled to said first stage pull-down driver;
   a first pull-down transistor coupled to said second stage pull-down driver and said output line, a state transition on said first pull-down transistor discharging current to said logical ground node, thereby producing increased voltage on said logical ground node;
   a compensating driver coupled to said first stage pull-down driver; and
   a second pull-down transistor coupled to said compensating driver, said output line, and said logical ground node, said second pull-down transistor discharging current to said logical ground node during a state transition, thereby producing increased voltage on said logical ground node, said compensating driver providing a drive current to the gate of said second pull-down transistor which is inversely proportional to the magnitude of said increased voltage on said logical ground node.

10. The apparatus of claim 9 wherein said compensating driver includes a drive transistor with a gate coupled to said logical ground node.

11. The apparatus of claim 9 wherein said compensating driver is coupled to a supplemental compensator, said supplemental compensator providing a reduced voltage to said compensating driver during the presence of said increased voltage on said logical ground node.

12. The apparatus of claim 9 further comprising a clamping circuit coupled to the gate of said second pull-down transistor, said clamping circuit cooperatively interacting with said compensating driver to generate a substantially constant drive current to said pull-down transistor during said increased voltage on said logical ground node.

13. A method of compensating for ground bounce in an output buffer, said method comprising the steps of:
providing a pull-up transistor, the gate of said pull-up transistor being coupled to an input line, the output of said pull-up transistor being coupled to an output line;
utilizing a pull-down transistor, the gate of said pull-down transistor being coupled to said input line, the drain of said pull-down transistor being coupled to said output line, and the source of said pull-down transistor being coupled to a ground node, a state transition on said pull-down transistor discharging current to said ground node, thereby producing increased voltage on said ground node; and
compensating for said increased voltage on said ground node by regulating drive current to said pull-down transistor at a rate inversely related to said increased voltage on said ground node.

14. The method of claim 13 further comprising the step of employing a supplemental compensating means, said supplemental compensating means limiting the voltage to said compensating means during said increased voltage on said logical ground node.

15. The method of claim 14 further comprising the step of using ground bounce clamping means for generating a substantially constant drive current to said gate of said pull-down transistor.

* * * * *